United States Patent [19]
Nance et al.

[11] 3,980,953
[45] Sept. 14, 1976

[54] DELTA MODULATION SYSTEM EMPLOYING DIGITAL FRAME AVERAGING

[75] Inventors: W. Franklin Nance, Orange; Ronald J. Surprenant, Anaheim, both of Calif.

[73] Assignees: NS Electronics, Fresno; Lear Siegler, Inc., Santa Monica, both of Calif.; part interest to each

[22] Filed: Mar. 17, 1975

[21] Appl. No.: 559,177

Related U.S. Application Data
[63] Continuation-in-part of Ser. No. 359,864, May 14, 1973, Pat. No. 3,872,255.

[52] U.S. Cl. .......................... 325/38 B; 179/15 AP; 332/11 D; 340/347 AD; 340/347 DD
[51] Int. Cl.² ...................................... H03K 13/11
[58] Field of Search.................. 179/15 AP, 15 BM; 325/38 B; 332/11 D; 340/347 AD, 347 DD

[56] References Cited
UNITED STATES PATENTS
3,878,465    4/1975    Stephenne .................. 332/11 D OTHER PUBLICATIONS
IBM Technical Disclosure Bulletin, vol. 15, No. 11, Apr. 1973, by Johnson et al.

*Primary Examiner*—David L. Stewart
*Attorney, Agent, or Firm*—Gregg, Hendricson, Caplan & Becker

[57] ABSTRACT

A delta modulator produces a digital bit stream from an input analog waveform and applies same to bit-averaging circuitry dividing the bit stream into time-frame intervals and computing the average slope per frame. Each average time-frame slope value is transmitted over a communication system as a discrete digital signal and at a receiver each such signal is employed to set the gain of a multi-level integrator and thus incrementally reconstruct the original waveform.

4 Claims, 4 Drawing Figures

FIG-2
| WORD # | FOUR BIT FRAME WORD | AVERAGE SLOPE/FRAME |
|---|---|---|
| 1 | 0 0 0 0 | -4 |
| 2 | 0 0 0 1 | -2 |
| 3 | 0 0 1 0 | -2 |
| 4 | 0 0 1 1 | 0 |
| 5 | 0 1 0 0 | -2 |
| 6 | 0 1 0 1 | 0 |
| 7 | 0 1 1 0 | 0 |
| 8 | 0 1 1 1 | +2 |
| 9 | 1 0 0 0 | -2 |
| 10 | 1 0 0 1 | 0 |
| 11 | 1 0 1 0 | 0 |
| 12 | 1 0 1 1 | +2 |
| 13 | 1 1 0 0 | 0 |
| 14 | 1 1 0 1 | +2 |
| 15 | 1 1 1 0 | +2 |
| 16 | 1 1 1 1 | +4 |
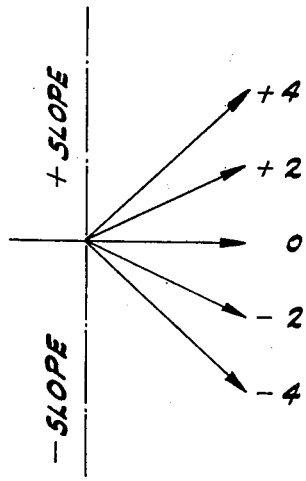
FIG-3
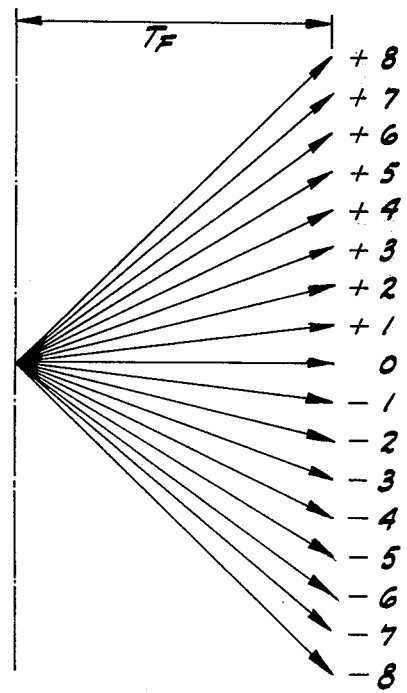
FIG-4

DELTA MODULATION SYSTEM EMPLOYING DIGITAL FRAME AVERAGING

This is a continuation-in-part of copending U.S. patent application Ser. No. 359,864 filed in the U.S. Patent Office on May 14, 1973 now U.S. Pat. No. 3,872,355 issued Mar. 18, 1975 and entitled "Digital Communications System with Time-Frequency Multiplexing."

BACKGROUND OF INVENTION

Delta modulation is commonly employed in communication systems such as telephone systems to convert the rate of change (slope) of an analog input signal, i.e., voice signal, into a binary bit stream for transmission. The received binary bit stream is then employed to reconstruct the analog input signal. Delta modulators are conventional and, while quite simple, suffer from an inability to respond to sudden changes in signal amplitude. This problem, commonly termed "slope overload," requires some type of solution which, unfortunately, then produces another disadvantage which is the generation of excessive "quantizing noise" for low level signals. Prior art approaches to the problem include the use of adaptive schemes wherein special circuitry is employed to adjust the size of the quantizing steps in the reconstructed signal in order to more nearly approximate the original signal.

Adaptive systems themselves have certain disadvantages in addition to the electronic complexity thereof and one of these disadvantages arises from the length of time required for the adaptive circuits of the demodulator to lock into the proper reference level established by the modulator. This "initializing time" is often long compared to the period of speech waveforms with the result that noise is generated by the demodulator until it has arrived at the proper reference level. Another disadvantage of adaptive systems arises when there are abrupt transitions from speech signals to silence, inasmuch as a brief noise pattern is produced which may persist at a level which is dependent on the nature of the transition and may be a source of annoyance to a listener because of signal dependence thereof. Additionally, adaptive systems normally employ one or more closed feedback loops in the modulator and it is recognized that such loops are potentially unstable and have a tendency to oscillate, which may cause the reference levels to fluctuate and thus cause the demodulator to follow these fluctuations with the general result of generating a noise at the frequency of the loop oscillation.

The present invention provides the advantages of adaptive systems without incorporating the above-noted disadvantages.

SUMMARY OF INVENTION

The present invention is adapted for use in a communication system wherein a transmitter receives an analog input waveform such as, for example, voice signals and transforms such input into some type of digital signals which are then transmitted over the communication medium to a receiver whereat the digital pulse train is employed to reconstruct the original analog input. It is herein provided that a non-adaptive modulator shall be employed to produce a binary bit stream from the analog input waveform. A conventional delta modulator may be employed as the modulator with one of the binary bit levels in the output thereof representing a samle of rate of change of the input analog signal in one direction, and the other level of binary bits representing a sample of the rate of change of input analog signal in the opposite direction. The present invention provides bit-averaging circuitry connected to the output of the delta modulator noted above and this circuitry divides the bit stream into time-frame intervals and concurrently computes the average slope in each time frame. The average slope value for each frame is then transmitted to the receiver as a discrete digital signal. Slope averaging may be accomplished by a binary up-down counter, which is reset to one-half the maximum count as a reference state at the beginning of each time frame. At the end of each time frame the counter will have accumulated a count which represents the difference between the number of logic 1's and logic 0's with respect to its reference state, and the accumulated count corresponds to an average slope during each time frame. The output (accumulated count) of the counter is a digital representation of this average slope which is then transmitted to a demodulator at the receiver.

The present invention at the receiver detects the signal from the counter during each time frame to control the gain of a multi-level integrator. The output of the integrator occurring during each time frame then contributes to the reconstructed shape of the analog signal and a band-limited amplifier may be employed to reduce unwanted high-frequency components in this reconstructed signal.

DESCRIPTION OF FIGURES

The present invention is illustrated as to a single preferred embodiment thereof in the accompanying drawings wherein:

FIG. 2 is a table relating all possible four bit frame words to the average slope per frame for each;

FIG. 3 is a representation of all average slope-per-frame values for four samples per frame; and FIG. 4 is a representation of all average slope-per-frame values possible with 16 samples per frame.

DESCRIPTION OF PREFERRED EMBODIMENT

Figure 1:
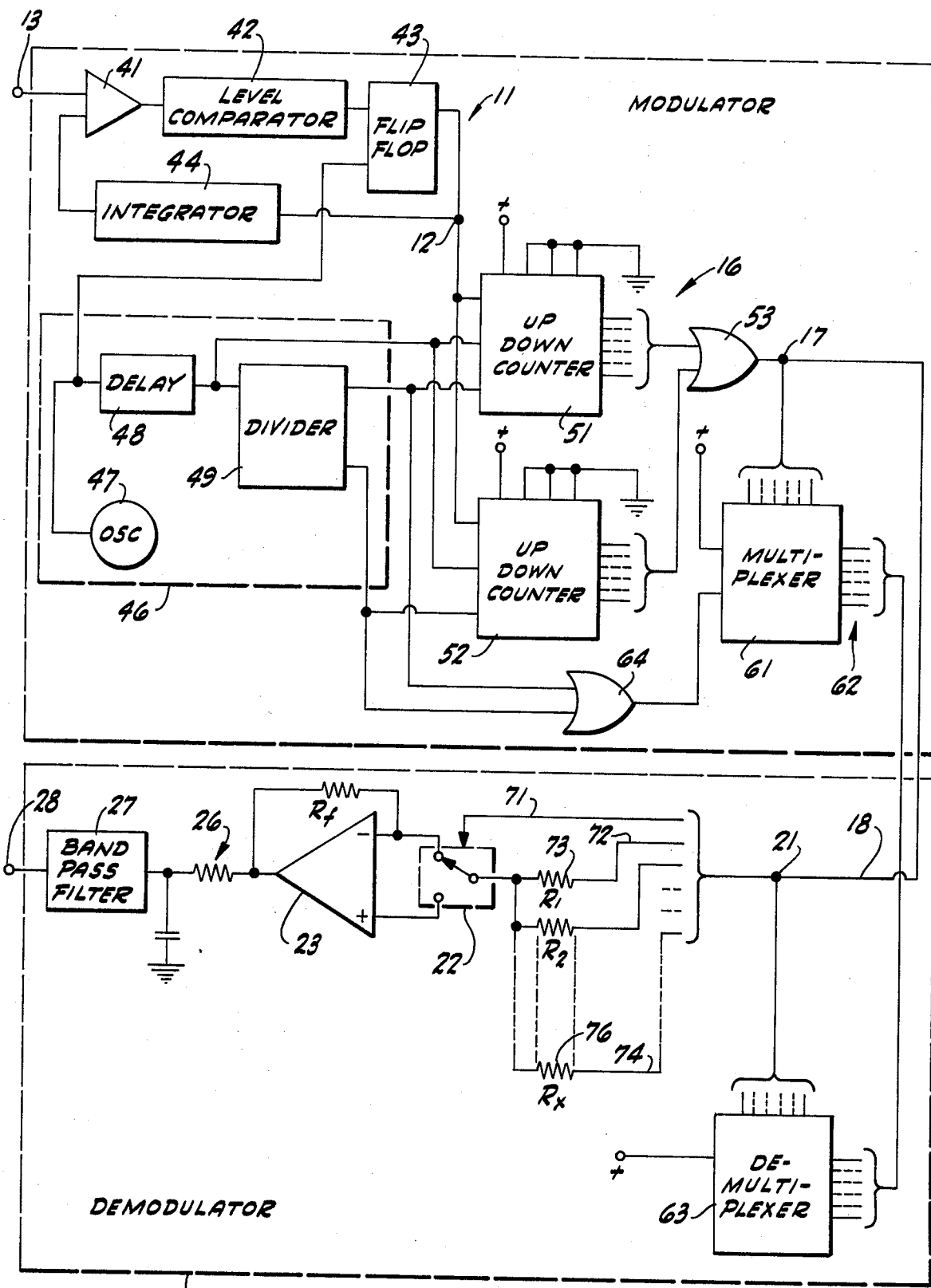
FIG. 1 is a block diagram of an electrical circuit embodying the present invention.

The present invention is particularly adapted for cooperation with and, in fact, incorporation in the communication system of U.S. patent application Ser. No. 359,864 and reference is herein made thereto. The present invention is general comprises a modulator 10 including a non-adaptive delta modulator 11 receiving input analog signals such as voice signals and producing at an output terminal 12 a binary bit stream at the rate of an input sample pulse. It is noted that the analog input signal at an input terminal 13 of the delta modulator is normally bandwidth limited and the sample rate in the delta modulator is preferably in excess of 10 times that of the highest frequency contained in the bandwidth limited input signal at terminal 13. The output of the delta modulator 11 represents the rate of change of the input analog signal at the sample rate and one of the binary bit levels in the output of the delta modulator represents a sample of rate of change of the input analog signal in one direction while the other level of binary bit output represents a sample of rate of change of the input analog signal in the opposite direction. Conventional non-adaptive delta modulators suffer from an inability to respond to sudden changes in input signal amplitude so as to produce noise in the demodulator output and this is commonly denominated as slope overload. Attempts to correct for slope overload introduce noise at low signal levels at the input terminal 13 and this is commonly termed quantizing noise.

The present invention employs a frame-oriented bit-averaging circuit 16 connected to the output of the delta modulator at terminal 12 for the purpose of greatly reducing the above-noted undesirable effects and producing at a modulator output terminal 17 a digital signal representing one of a predetermined number of slopes of analog signal at input terminal 13 present during each frame interval. The output of the modulator 10 appearing at terminal 17 is transmitted over some type of communication medium, illustrated only as line 18, to the input terminal 21 of a demodulator 22. At terminal 21 the most significant bit in each frame is employed to select slope polarity with respect to zero slope. This first bit in each frame is employed to operate a switch 22 having the output terminals thereof connected to plus and minus inputs of a multi-level integrator amplifier 23. The position of switch 22 will thus be seen to be set by the first bit in each frame. The remaining bits in each frame select the combination of resistors to adjust the amplifier gain. An integrator 26 reconstructs the analog waveform; however, such reconstructed waveform may include undesired high-frequency components which are herein removed by a bandpass filter 27 and the resultant reconstructed waveform appears at an output terminal 28.

It will be seen from the foregoing general description of the present invention that, contrary to conventional practice, the present invention does not provide for the application to a demodulator of a delta modulator output. It is provided herein that the delta modulator output shall be averaged over each time frame to produce a binary signal representing one of a predetermined number of average slopes of the input analog waveform operated upon by the delta modulator. These average slope signals are then applied to the demodulator and it is noted in this respect that the integrator of a demodulator is actually only capable of following average values anyway so that little, if anything, is lost by the transmission of average slope values. A very substantial advantage is achieved herein by materially reducing the number of signals transmitted per time frame, for example, so that it is then possible to materially increase the sampling rate so as to more faithfully reconstruct the original waveform. The problems of slope overload and quantizing noise are almost completely overcome by the present invention.

Considering now the illustrated preferred embodiment of the present invention in detail and referring again to FIG. 1 of the drawings, it is noted that the analog signal appearing at the input terminal 13 may have one of three states of interest with regard to the incremental sampling thereof. These three states are (1) a rate of change in a positive direction, (2) rate of change in a negative direction, or (3) an idle condition wherein there is neither a positive nor negative change in amplitude of the input signal. Considering the delta modulator 11, it is noted that some incorporates an analog comparator 41 which may comprise an integrated circuit differential operational amplifier having one input terminal connected to the modulator input terminal 13 and applying the output thereof to a level comparator 42 which in turn applies the output thereof to a data type flip-flop circuit 43. The output of the flip-flop circuit 43 appears at output terminal 12 and is also applied through an integrator 44 to the other input of the amplifier 41. There is also applied to the flip-flop circuit 43 a clock pulse or sample pulse occurring at a sample rate which, as noted above, is preferably in excess of ten times the highest frequency included in the analog signal applied to the input terminal 13. This sample pulse is shown to be provided from a timing generator 46 including an oscillator 47 producing what may be termed an early sample pulse that is applied as an input to the flip-flop 43. The delta modulator, which is generally conventional, incorporates a small time delay in the loop thereof so that the input to the amplifier 41 ideally comprises the analog waveform and the analog waveform incrementally delayed so that the output of the amplifier 41 is a difference therebetween. It is again noted that the input analog signal is band-limited so that the highest frequency contained therein is at the upper end of this band limit and cannot change at a rate which is higher than permitted by the upper limit. This then imposes a limitation upon the possible slope of the input waveform. The difference signal from the amplifier 41 is applied to the level comparator 42 which compares the difference signal to a dc reference level and thus produces an output signal which is binary in nature. For example, a positive difference signal applied to the comparator 42 peoduces a positive output signal from the comparator 42 and a negative difference signal produces a relatively negative output signal therefrom, usually a zero voltage level (logic 0). The output signal from the comparator is applied to the data input terminal of the flip-flop 43 which, as noted above, also receives a clock pulse or sample pulse from the timing generator 46. The output signal at terminal 12 from the flip-flop 43 takes on the state of the data input signal when the clock input pulse goes positive, for example. It will thus be seen that the signal appearing at terminal 12 is a typical non-adaptive delta modulated bit stream in which a binary 1 denotes a positive slope and a binary 0 denotes a negative slope. The loop of the delta modulator 11 is closed by the integrator 44 which may typically comprise a simple RC circuit or an RC circuit and operational amplifier combination. The function of the integrator is to receive the bit stream at terminal 12 and to produce a reconstructed analog signal which is applied as the other input to the amplifier 41. It is noted that idle intervals in the analog signal at the input terminal 13 cause a "dither" action wherein the signal at the output terminal 12 is a symmetrical pattern of logic 1's and logic 0's. This "dithering" action is the result of a stored state in flip-flop 43 causing the output of a level comparator to be driven to the opposite state setting the flip-flop to the opposite state of the next sample pulse. This action alternates from one clock pulse to the next producing a string of 101010 . . . or 010101 . . . at the flip-flop output terminal 12. This will normally then cause the demodulator to produce an oscillatory waveform causing quantizing noise. The present invention precludes this output, as further described below.

Considering now the frame-oriented bit averaging circuit 16, hereinafter termed the averaging circuit, there will be seen to be provided a pair of like up-down counters which in themselves may be conventional, commercially available units. The delta modulator output terminal 12 is connected to a count terminal of each of the counters 51 and 52. The counters are arranged to alternately count input signals for a predetermined period of time, termed a time frame or frame, as employed, for example, in U.S. patent application Ser. No. 359,864. The counters 51 and 52 also receive late sample pulses from the timing generator 46 and these pulses are slightly delayed from the early sample pulse applied to the flip-flop 43 by delay circuitry 48. The delay is slightly more than that of the flip-flop. There is also applied to the up-down counters 51 and 52 alternate frame signals or complementary frame signals from the divider 49 in the timing circuit 46 which applies to counter 51 a positive signal for one frame while applying a negative signal to counter 52 and in the next frame applies a positive signal to counter 52 and a negative signal to counter 51 so as to alternately enable the counters to receive and count input signals. The counters 51 and 52 are preset or preloaded manually by connection of appropriate circuit elements to ground or plus voltage, for example, in order to set the counter to count from a predetermined number.

Considering now the operation of the counters 51 and 52, it is noted that the condition at the beginning of each frame must be preset alternately into the counter outputs to establish the center reference value which is best related to a slope of zero degrees. Presetting is accomplished as noted above. The counters operate when enabled such that each binary bit at the input count terminal thereof causes the counts to be accumulated, usually such that, if a logic 1 is present at the time of a late clock pulse, the counter counts up and vice versa for a logic 0. Thus it will be seen that a counter enabled for the time of a frame will have an accumulation of counts at the end of the frame which is the difference of the total number of logic 1's and logic 0's taken in respect to the mid-value count which was preset into the counter at the beginning of the frame. Each accumulated count that is possible with a given number of bits per frame is made to represent a slope value with the mid-value representing zero slope. The foregoing is illustrated in FIG. 2 for the simple example of a four sample per frame situation. It will be seen that, with four samples per frame, there are possible sixteen four bit frame words and that a counter such as up-down counter 51 will produce the possible counts shown at the right of FIG. 2 as average slope per frame signals. These slopes are illustrated in FIG. 3 and it will be seen that there are five possible slopes including zero. It is this average slope per frame which is transmitted in the form of binary signals to the demodulator. Thus it will be seen that, instead of 16 possible words to transmit from modulator to demodulator, th present invention provides for the transmission of only five possible words. It is also noted that, because of the bandwidth limitation upon the analog input signal to the modulator, certain of the four bit frame words of FIG. 2 are not possible and thus words Nos. 3, 5, 6, 11, 12 and 14 will not occur because of the abrupt transition therein. From FIG. 3 it will be seen that this simplified example of a four bit frame word, i.e., four samples per frame, provides a range of four wherein the range is defined as the maximum charge in slope per frame and a resolution of two which is the minimum change in slope per frame. It is not intended by this example to suggest utilization of four samples per frame but, instead, the illustrations of FIGS. 2 and 3 are provided to indicate the improvement achieved by the present invention and a simplified example thereof.

As noted above, the counters 51 and 52 are enabled in alternate frames so that the count in counter 51 is collected for a frame in which the counter is enabled and during the next frame this count is transmitted to the demodulator while the counter 52 is enabled to receive input signals and count same. This allows the four bit word in the foregoing example to be used as a coded word representing the average slope per frame rather than the actual delta modulator output. The outputs of the counters 51 and 52 are applied to an OR gate 53 and there is preferably provided an enable/disable feature in the form of AND transmission gates in the output lines of each of the counters with each counter output line connected to one input of each AND gate and an enable or disable signal from one or other of the divider outputs applied to the other inputs of the AND gates to accomplish alternate transmission of counter signals.

The binary words appearing at modulator output terminal 17 may be directly transmitted to the demodulator or over some sort of transmission system 18, or transmission may be accomplished by a multiplexer 61 having an input connected to modulator output terminal 17 and comprising, for example, a conventional integrated circuit which employs binary-state inputs to control selection of one of a predetermined number of output lines each corresponding to a slope representation that is to be transmitted to the demodulator. The binary input is gated by an OR circuit 63 connected to the divider outputs, i.e., frame signals. The output of the multiplexer 61 at a plurality of output terminals 62 is transmitted to the modulator in place of the binary states at terminal 17.

Considering now the demodulator of the present invention in somewhat more detail, it is noted that the input thereof may comprise the above-noted binary states applied to the terminal 21 or, alternatively, a demultiplexer 63 may be employed to receive the output of multiplexer 61 and return the information therefrom to the binary states which are then applied to terminal 21. Terminal 21, as terminal 17, actually comprises a plurality of terminals and the first of these is connected to a line 71 extending to the control terminal switch 22. The second line 72 is connected through a resistor 73 to the switch arm of switch 22 and subsequent terminals are connected to further lines through resistors to the switch arm to the final line 74 connected through resistors 76 to the switch arm. The values of the resistors 73, etc., are particularly chosen, as noted below, so as to apply weighted signals to the operational amplifier 23 through the switch 22. Considering an example of operation wherein the modulator timing generator 46 is generating at sample frequency of 200 kHz and a frame rate of 12.5 kHz with alternate frame rate signals from the divider 49 occurring at one-half of this rate of 6.25 kHz. Each frame time will therefore be seen to be 80 microseconds so that the concurrent bit states at terminals 21 of the demodulator are present for this 80 microsecond interval and each bit has a weighted value in the binary number system. In this example, if a four bit word is present in the form of a 1000 word, the most significant bit, i.e., the first bit appearing on line 71, is a logic 1 which is normally a positive voltage and this is employed to control a switch 22 to connect the input resistors to the positive input of amplifier 23. In the binary word 1000 the remaining leads at terminals 21 each have a logic 0 thereon which is usually a zero voltage level. Consequently each resistor would be tied to zero volts and the output of the integrator amplifier 23 would also be zero. This 1000 binary word is always present when there is an idle pattern in the input analog signal at terminal 13. In all other cases where there is a rate of change occurring in the input analog signal a bit-averaged result is sent to the demodulator 22.

Continuing with the foregoing example, it will be noted that, with the frequencies set forth above, there are sixteen samples per frame and the total possible combinations of bit states with their corresponding slope representations are:

| | |
|---|---|
| 00000 = −16 (slope level) | 10000 = zero slope |
| 00001 = −14 | 10001 = +2 |
| 00010 = −12 | |
| . | . |
| . | . |
| 01111 = −2 | 11111 = +16 |

The pattern above is related to the fact that there are 16 binary bits per frame time and, for example, the sum of 16 zero bits is a binary 00000 with the fifth bit being needed because the up-down count starts from a value equal to binary $10000_2$ or $16_{10}$. If there were sixteen logic 1 bits in a row, the binary word would be $11111_2$. To reduce the weighting considerations at the input of the integrator amplifier 217 each of the above slope values can be represented as:

| | |
|---|---|
| −16 = slope of −8 | 0 = zero slope |
| −14 = slope of −7 | +2 = slope of +1 |
| . | . |
| . | . |
| −2 = slope of −1 | +16 = slope of +8 |

The resistors 73, etc., which may be designated $R_1$, $R_2$ to $R_x$ are weighted in relation to the operational amplifier resistor $R_f$ in terms of $A$, the closed-loop gain of amplifier 23, as follows:

$$A \quad R_f/R_1 \, e_1 + R_f/R_2 \, e_2 \ldots R_f R_x \, e_x$$

wherein $e_1, e_2 \ldots e_x$ are the signals applied on the successive terminals at 21. It will be seen that, for each selected slope value, the combined weighting of the amplifier gain-setting resistors causes the amplifier to apply a step of voltage of the correct polarity and amplitude to the integrator such that the RC circuit thereof produces the desired slope to reconstruct the original analog waveform. From each selected level each previous slope is stored in the capacitor so that the sequential slopes reconstruct the analog signal shape, except for the fact that there is a small amount of undesired high-frequency component which may be removed by the bandpass filter 27 so as to provide the output terminal 28 a faithfully reconstructed analog waveform originally appearing at input terminal 13. The 16 sample per frame example set forth above provides a possibility of seventeen average slope per frame values, as illustrated in FIG. 4 wherein $T_F$ is a time frame duration. Sixteen of these possible slopes can be transmitted during the same four bit frame as a conventional delta modulation system. Inasmuch as an odd number of slopes is required for symmetrical slope overload or range, only 15 of the slopes are normally employed so that +8 and −8 are not used. It is appreciated that this will make the range of the receiver one less than that of the transmitter and, if desired, it is possible to use the 16th word to transmit each of the two maximum slopes during alternate frames so that the range of the receiver would be only one-half less than that of the transmitter. Considering further a comparison between the present invention of the above example and conventional delta modulation and demodulation having four samples per frame, it will be seen that the range has been increased from four to seven and the resolution from two to one. The sampling rate is actually four times that of the conventional system which gives rise to $2^{16}$ or 65,536 different 16 bit words which represent 17 different slopes during one frame. A comparison of the illustrations of FIGS. 3 and 4 establishes the above-noted increase in range and resolution by the present invention. This is highly significant in delta modulation and demodulation to accurately reproduce an input analog waveform. It is also noted that in the present invention the quantizing noise as classically defined is zero and the problems of slope overload, i.e., inability to follow certain slope changes, has been materially reduced. There is thus realized by the present invention a system with a quality of non-adaptive delta modulation that employs a high sampling rate, such as 200 kHz, with only a four bit per frame transmission rate over the transmission system. This is accomplished without the complications and inherent disadvantages of adaptive systems and with no "dither" pattern transmitted during idle patterns of input. It is possible to provide a general expression applicable to the present invention. If the binary bit stream word length in the modulator is N bits per frame, then N+1 different averages (including zero) are required of N bits. It is desired in the present invention that N be an even number so that each frame has a zero for idle pattern. The average or algebraic sum $S$ is then given by the relationship $S = 2n - N$ where $n =$ the number of binary logic 1's in the word. It is again noted that the maximum number of states or average values that can be represented by these sums is N+1. Employing the foregoing example of sampling rate and frame rate, let it be assumed that there are seven logic 1 bits in a 16 bit word so that, employing the foregoing formula, $(2 \times 7) - N = 14 - 16 = -2$, which from the table set forth above represents a slope of −1. As another example, considering the 16 bit word, $1110000111111111_2$, wherein the total number of logic 1 bits is 3+9 = 12, the algebraic sum or slope may thus be calculated as $(2 \times 12) - 16 = +8$ or a slope value of +4.

It will be seen that the present invention provides a material advancement in the field of delta modulation to overcome prior art problems of quantizing noise and slope overload without the complexity and difficulties of adaptive systems. It will be appreciated that modifications and variations may be made in the present invention within the scope of this invention and thus it is not intended to limit the invention to the details of illustration or precise terms of description.

What is claimed is:
1. An improved delta modulation system comprising
   a non-adaptive delta modulator producing a binary bit stream from an analog input waveform at a sample pulse rate,
   a pair of up-down counters alternately enabled at a predetermined frame rate to count the algebraic sum of binary input signals from said delta modulator during alternate frames and each storing the count thereof and transmitting upon a transmission system the binary algebraic sum count during the preceding frame, an amplifier connected to said transmission system through gain-adjusting means for producing a pulse train having pulse heights determined by said binary algebraic sum count, and an integrator connected to the output of said amplifier for reconstructing at the integrator output the analog waveform applied to said delta modulator.

2. The system of claim 1 further defined by bandwidth limiting means applying an analog waveform to said delta modulator, a generator producing sampling pulses at a rate of ten or more times the highest frequency of input analog signal and applying same to said delta modulator whereby the binary bit stream has a rate of said sampling pulse rate, and said counters being presettable to a predetermined number from which algebraic counting per frame is made.

3. The system of claim 1 further defined by said binary bit stream representing change in slope of said analog signal per sample period, said up-down counters counting up one for each binary 1 and down one for each binary 0 to produce upon a plurality of output lines binary signals representing average slope per frame, and said gain-adjusting means comprising a plurality of resistors connected one for each binary output line to thus adjust the amplifier gain in accordance with said average slope per frame.

4. The system of claim 1 further defined by each of said counters being preset to a predetermined initial count per frame representing a zero slope whereby the outputs of the counters are plus or minus and the amplifier gain control means including switching means operated by one bit of the binary count per frame to switch the input between plus and minus inputs of the amplifier.

* * * * *